United States Patent

Hackmann et al.

[15] 3,650,745

[45] Mar. 21, 1972

[54] PRINTING PLATE CARRYING A PHOTOACTIVE LAYER

[72] Inventors: Ernst-August Hackmann, Wiesbaden-Dotzheim; Erwin Lind, Auringen uber Wiesbaden, both of Germany

[73] Assignee: Kalle Aktiengesellschaft, Wiesbaden-Biebrich, Germany

[22] Filed: Aug. 28, 1968

[21] Appl. No.: 755,807

[30] Foreign Application Priority Data

Aug. 31, 1967 Germany ......................P 15 97 784.1

[52] U.S. Cl. ..............................................96/35.1, 96/115 P
[51] Int. Cl. ..............................................G03c 1/70
[58] Field of Search ......................................96/115 P, 35.1

[56] References Cited

UNITED STATES PATENTS

| | | | |
|---|---|---|---|
| 3,257,203 | 6/1966 | Süs et al. | 96/1.5 |
| 3,042,518 | 7/1962 | Wainer | 96/115 X |
| 3,374,094 | 3/1968 | Wainer et al. | 96/90 X |
| 3,479,185 | 11/1969 | Chambers | 96/115 X |
| 3,495,987 | 2/1970 | Moore | 96/115 |

FOREIGN PATENTS OR APPLICATIONS

| | | | |
|---|---|---|---|
| 1,490,910 | 6/1967 | France | 96/115 |

*Primary Examiner*—Ronald H. Smith
*Attorney*—James E. Bryan

[57] ABSTRACT

This invention relates to a photoactive layer, particularly adapted for use in the preparation of printing plates, which comprises a compound corresponding to one of the following general Formulae

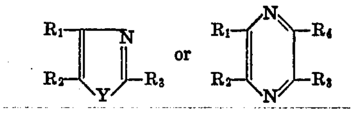

wherein:

$R_1$ and $R_2$ which may be identical or not, are aryl or heteroyl groups which may be substituted, or form members of an aromatic or pyridine ring, $R_3$ is $-CH{=}CH_2$ or $-RCH{=}CH_2$, with R being arylene, naphthylene, or heteroylene, $R_4$ is either identical with $R_3$, or is an aryl or heteroyl group which may be substituted, and Y is NH, S, Se, or O.

21 Claims, No Drawings

PRINTING PLATE CARRYING A PHOTOACTIVE LAYER

The present invention relates to a printing plate carrying a photoactive layer the solubility characteristics of which change in the light-struck areas during image-wise exposure, so that it is possible to remove the nonexposed areas by treatment with a suitable solvent and to convert the plate either into an offset plate or a relief plate, depending on the kind of support used and the thickness of the layer.

Printing plates having photopolymerizable reproduction layers are known, which layers contain polymerizable compounds with olefinic double bonds together with components which initiate the polymerization thereof during exposure to light.

The light-sensitivity of these layers is not always satisfactory, so that it has been suggested to perform the photopolymerization of the reproduction layer with the exclusion of oxygen. However, this method is time-consuming and cumbersome and is, therefore, only reluctantly employed.

Furthermore, many of the above described printing plates have the disadvantage that the polymerization catalysts incorporated therein become active, without light action, by the influence of elevated temperatures such as are encountered in the tropics or subtropics, and also in temperate zones in non air-conditioned rooms during the summer months. This causes the printing plates to become partially polymerized during storage, so that they can no longer be developed without blacking up.

The printing plate according to the present invention, which requires no separate photo-catalyst, constitutes an improvement over the known plates.

The present invention provides a printing plate carrying a photoactive layer which consists wholly or partially of a compound corresponding to one of the following general formulas:

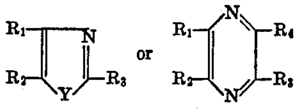

wherein:

$R_1$ and $R_2$ which may be identical or not, are aryl or heteroyl groups which may be substituted, or form members of an aromatic or pyridine ring, $R_3$ is $-CH=CH_2$ or $-RCH=CH_2$, with R being arylene, naphthylene, or heteroylene, $R_4$ is either identical with $R_3$, or is an aryl or heteroyl group which may be substituted, and Y is NH, S, Se, or O.

Examples of suitable light-sensitive heterocyclic compounds containing vinyl groups, which yield particularly good results according to the present invention, are listed in Tables I and II below:

TABLE I

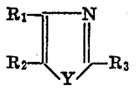

| | $R_1$ | $R_2$ | $R_3$ | Y |
|---|---|---|---|---|
| 1 | 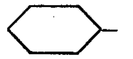 | 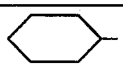 | $-CH=CH_2$ | O |
| 2 | 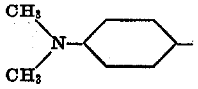 | 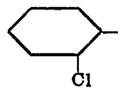 | | |
| 3 | 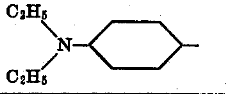 | | | |
| 4 | 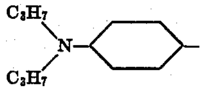 | | | |
| 5 | 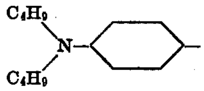 | | | |
| 6 | 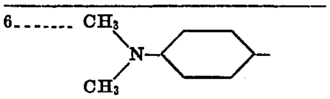 |  | | |
| 7 | | 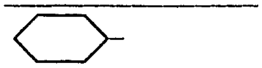 | | |
| 8 |  | 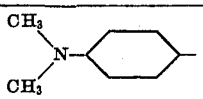 | | |
| 9 | 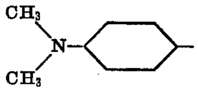 | 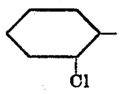 | | S |
| 10 | | | | Se |
| 11 | | | | NH |
| 12 | 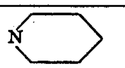 | 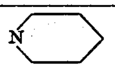 | | O |

Table I – Continued

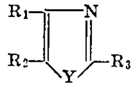

| | $R_1$ | $R_2$ | $R_3$ | Y |
|---|---|---|---|---|
| 13 | | 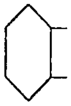 | 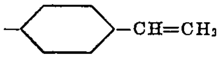 | |
| 14 | 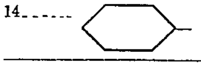 | 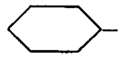 | | |
| 15 | 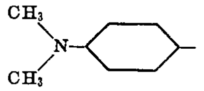 | 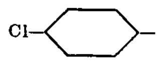 | | |

TABLE II

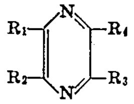

| | $R_1$ | $R_2$ | $R_3$ | $R_4$ |
|---|---|---|---|---|
| 16 | 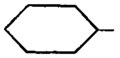 | 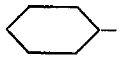 | 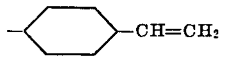 | 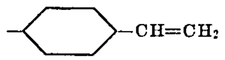 |
| 17 | | 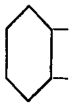 | | |
| 18 | | 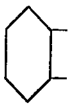 | 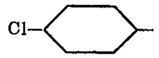 | |
| 19 | | 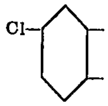 | 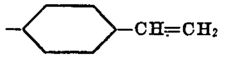 | |
| 20 | | 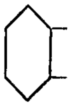 | 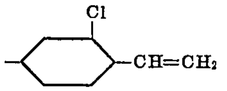 | |
| 21 | | 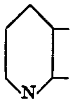 | 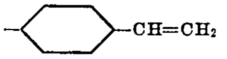 | |
| 22 | | 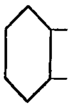 |  | |

The reproduction layer may consist of one or more heterocyclic vinyl compounds alone, which has the advantage that a good differentiation between the exposed and unexposed areas can be achieved with dilute aqueous solutions, e.g., phosphoric acid. In some cases, it may be advisable to add binding agents to the reproduction layer. Besides causing a good adhesion of the layer to the support, they render the layer easily developable. The binders must dissolve readily in developing agents which do not attack the exposed layer. Since it is desirable, from the point of view of facilitating the printing process, to work with alkaline developer solutions, binders are preferred which contain groups rendering them alkali-soluble. Such groups are, e.g.: acid anhydride groups, carboxylic groups, sulfonic acid groups, sulfonamide groups, or sulfonimide groups. Resins having a high acid number are preferred, because they dissolve with particular ease in alkaline solutions. Copolymers of styrene and maleic anhydride have proved to be especially suitable.

The proportion of binder may vary within wide limits. Normally, favorable results are obtained with a binder content of 0.1 to 2 parts of binder per part of light-sensitive substance.

Furthermore, known sensitizers, such as dyestuffs or dyestuff mixtures, may be added to the layers according to the invention in order to increase their light-sensitivity. Thioflavin is excellently suited as a dyestuff sensitizer, but Dianil Yellow3G and Eosine (yellow) also may be used with advantage.

The photopolymerizable layers of the prior art frequently have cross-linking agents incorporated therein, such as unsaturated compounds containing at least two vinyl groups. Compounds of this type are described, e.g., in: "Industrial and Engineering Chemistry," Vol. 31, No. 12/1949. The addition of such cross-linking agents to the reproduction layers according to the invention has a favorable effect upon their final hardness, so that more uniform prints and longer runs may be achieved. The light-sensitivity of the layers is not affected by such addition.

All materials known for the purpose may be used as supports for the reproduction layers of the invention, e.g., metals, paper, or plastic films. Alternatively, the reproduction layer may be used directly as a printing plate when it is in the form of a self-supporting film.

The printing plates according to the present invention are prepared in known manner. A solution containing the components is applied to the support. A mixture of toluene and methylglycol is preferred as the solvent, but other solvents conventionally used for this purpose may also be used.

Coating also is performed in a conventional manner, by whirl-coating or brushing in coating machines.

Self-supporting reproduction layers may be produced by casting or extrusion.

The printing plates according to the present invention are processed in known manner. Normally, they are exposed by the contact process, but episcopic or diascopic exposure also are possible. Excellent results are obtained by screening by means of a contact screen or an engraved glass plate. Negative originals preferably are used, because the reproduction material of the invention inverts the tone values so that positive copies are produced.

The range of radiation emitted by the light source used must be adapted to the range in which the layer has its maximum light-sensitivity. Since many of the compounds used according to the invention are particularly light-sensitive within the range of ultra-violet light, it is advisable to use such light sources as carbon arc lamps, mercury vapor lamps, fluorescent lamps containing fluorescent substances, which especially emit ultra-violet light, and also argon glow discharge lamps.

After exposure, the plates must be developed, because the non-exposed areas have retained their light-sensitivity. Normally, development is effected by wiping the plate with a suitable solvent mixture which dissolves the unexposed areas away, but does not attack the exposed areas. Solvent mixtures containing water, methanol, ethylene glycol and glycerol, with sodium metasilicate dissolved therein, have proved to be of advantage. Acid developers, such as aqueous phosphoric acid solutions, also are suitable. Whether an acid or an alkaline development process should be employed depends on the type of layer used, in particular on the binder present.

After development, the image areas of the layer are hydrophobic and accept greasy printing ink.

By deep-etching by means of a one-step or two-step etching process, letterpress printing forms may be obtained. When printing plates for relief printing are to be prepared from which only short runs are expected, it is not necessary for the reproduction layers to be fully exposed.

The printing plate may be further improved and still longer runs may be achieved by lacquering the plate with a lacquer which is absorbed by the image areas only and does not adhere to the image-free areas. Conventional lacquers of this type are described, e.g., in DAS No. 1,143,710, and Belgian Pat. No. 625,787.

As has already been mentioned, the layers according to the present invention are distinguished from those hitherto known in that they do not require a catalyst for photopolymerization, so that the disadvantages of a premature reaction during storage in the dark, caused by the presence of such catalyst, are avoided. Furthermore, the printing plates according to the present invention possess a good light-sensitivity and have good processing and printing qualities; they are in particular easily developed and yield long runs.

The invention will be illustrated in further detail by the following examples:

EXAMPLE 1

1 g. of the compound of Formula 3 above was dissolved in a mixture of 10 ml. of toluene and 10 ml. of methylglycol, and the solution was whirl-coated at a speed of approximately 120 revolutions per minute onto a support consisting of brushed aluminum. The coated plate was superficially dried in a current of warm air and then heated for 2 minutes to 100° C. in a drying chamber. The plate was exposed for 90 seconds in a vacuum printing frame under a line original, using a carbon arc lamp as a light source. Thereafter, the plate was developed, i.e., the unexposed areas of the layer were removed by means of a cotton pad soaked in a 5 percent aqueous phosphoric acid solution and then inked up with printing ink. Only the exposed image areas were ink-receptive, while the decoated areas were hydrophilic and repelled the printing ink. Flawless prints could be printed in an offset printing machine from a plate prepared in this manner.

Equally good results were obtained when a screened original was used instead of a line original for exposure.

EXAMPLE 2

Similar results were obtained by replacing the compound corresponding to Formula 3 by one of the compounds corresponding to Formulas 2, 4, 7 or 8, above, and then following the procedure described in Example 1.

EXAMPLE 3

When 0.1 g. of a maleic acid anhydride/styrene copolymer ("Lytron" 820, a commercial product of Monsanto) was added to the light-sensitive solution of Example 1, an acid developer could be employed, a 10 per cent phosphoric acid solution was necessary, however.

Equally good results were obtained when "Lytron" 820 was replaced either by resins of the polyacrylate type (trade name "Plexigum" MB 319), or by epoxy resins (trade name "Epikote" 1001, 1007, 1009), or by phenol resins of the novolak type (trade name "Alnovol" 429K).

EXAMPLE 4

An alkaline development of the printing plate was possible when 0.4 g. of "Lytron" 820 was added to the solution of Example 1, and the process described in Example 1 was repreated. The developer used consisted of a solution of sodium metasilicate (5 parts by weight) in a mixture of water (20 parts by weight), ethyleneglycol (30 parts by weight), methanol (20 parts by weight) and glycerol (20 parts by weight).

EXAMPLE 5

0.5 g. of the compound of Formula 17 above and 1 g. of "Lytron" 820 were dissolved in 25 ml. of toluene and 25 ml. of methylglycol and the solution was whirl-coated onto a brushed aluminum support. The plate was first superficially dried with a current of warm air and then heated for 2 minutes to 100° C., in a drying chamber. Exposure time under a carbon arc lamp was 15 seconds, and the developer used in Example 4 was used for development. Thereafter, the exposed areas accepted printing ink, while the unexposed areas were hydrophilic. A printing plate prepared in this manner could be used for printing in an offset printing machine.

Similar results were obtained when the support of brushed aluminum was replaced by one consisting of anodized aluminum.

EXAMPLE 6

A paper printing foil, i.e., a solvent-resistant paper support with a hydrophilic surface, was coated with the solution described in Example 5, but dried only by means of a current of warm air. Thereafter, the process described in Example 5 was followed. After inking up with printing ink, a negative image of the original was obtained. A printing plate prepared in this manner can be used with good success for printing in an offset printing machine.

EXAMPLE 7

The procedure described in Example 4 was repeated, using, however, a zinc plate as a support. The material was exposed for 5 minutes under an arc lamp. After development, the plate was etched for 5 minutes in a 6 per cent solution of nitric acid. By this treatment, the zinc was dissolved away from the bared areas, so that a relief image of the original was produced.

EXAMPLE 8

1.25 g. of the compound of Formula 3, 1 g. of "Lytron" 820, and 0.05 g. of thioflavine were dissolved in 50 ml. of toluene and 50 ml. of methylglycol, and the further procedure was as given in Example 4, with the exception that the exposure time could be reduced by one third.

EXAMPLE 9

When 0.1 g. of N,N'-methylene-diacrylic acid amide was added to the solution used in Example 4, with the procedure otherwise being that of Example 4, a printing plate was obtained from which a run could be printed which was longer by one third.

EXAMPLE 10

A substantial increase in the number of copies obtained also could be achieved by lacquering a plate, which had been prepared by the process described in Example 5 and then developed, with the lacquer described in Example 1 of Belgian Pat. No. 625,787, consisting of methyl glycol acetate, isopropanol, glycerol, ethylene glycol, a phenol resin, and Crystal Violet dyestuff.

It will be obvious to those skilled in the art that many modifications may be made within the scope of the present invention without departing from the spirit thereof, and the invention includes all such modifications.

What is claimed is:

1. A light-sensitive reproduction layer comprising at least one compound corresponding to the general formula

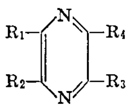

wherein $R_1$ and $R_2$ are selected from the group consisting of aryl or pyridyl groups or form members of an aromatic or pyridine ring; $R_3$ is selected from the group consisting of $—CH=CH_2$ or $—RCH=CH_2$, where R is selected from the group consisting of arylene and naphthylene groups; and $R_4$ is selected from the group consisting of groups identical to $R_3$, aryl, or pyridyl groups.

2. A light-sensitive reproduction layer comprising a cross-linking agent and at least one compound corresponding to the general formula

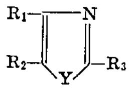

wherein $R_1$ and $R_2$ are selected from the group consisting of aryl or pyridyl groups or form members of an aromatic or pyridine ring; $R_3$ is selected from the group consisting of $—CH=CH_2$ or $—RCH=CH_2$, where R is selected from the group consisting of arylene and naphthylene groups; and Y is selected from the group consisting of NH, S, Se, or O.

3. A light-sensitive reproduction layer according to claim 2 containing a binder.

4. A light-sensitive reproduction layer according to claim 2 containing a sensitizer.

5. A light-sensitive reproduction layer according to claim 2 on a support suitable for use in planographic printing.

6. A light-sensitive reproduction layer according to claim 2 in which the compound has the formula

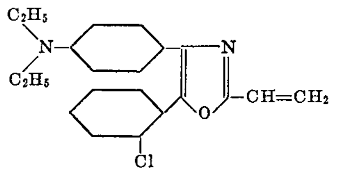

7. A light-sensitive reproduction layer according to claim 2 in which the compound has the formula

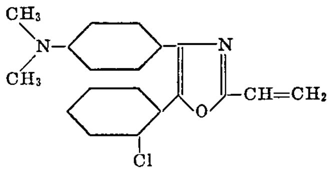

8. A light-sensitive reproduction layer according to claim 2 in which the compound has the formula

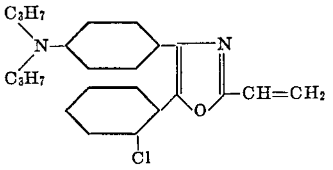

9. A light-sensitive reproduction layer according to claim 2 in which the compound has the formula

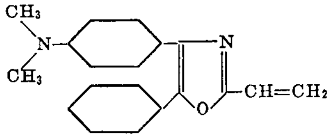

10 A light-sensitive reproduction layer according to claim 2 in which the compound has the formula

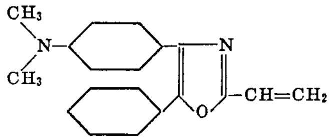

11. A light-sensitive reproduction layer according to claim 1 in which the compound has the formula

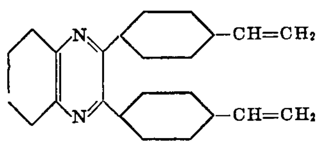

12. A photographic reproduction process which comprises exposing a supported light-sensitive layer to light under a master and developing the resulting image by dissolving away the unexposed areas in a solvent, the layer comprising at least one compound corresponding to one of the general formulas

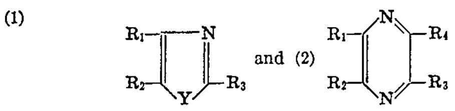

wherein $R_1$ and $R_2$ are selected from the group consisting of aryl or pyridyl groups or form members of an aromatic or pyridine ring; $R_3$ is selected from the group consisting of $—CH=CH_2$ or $—RCH=CH_2$, where R is selected from the group consisting of arylene and naphthylene groups; $R_4$ is selected from the group consisting of groups identical to $R_3$, aryl, or pyridyl groups; and Y is selected from the group consisting of NH, S, Se, or O.

13. A photographic reproduction process according to claim 12 in which the light-sensitive layer contains a binder.

14. A photographic reproduction process according to claim 12 in which the light-sensitive layer contains a sensitizer.

15. A photographic reproduction process according to claim 12 in which the light-sensitive layer contains a cross-linking agent.

16. A photographic reproduction process according to claim 12 in which the compound has the formula

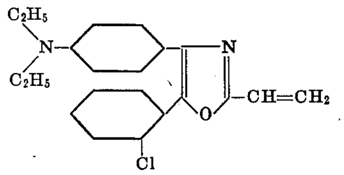

17. A photographic reproduction process according to claim 12 in which the compound has the formula

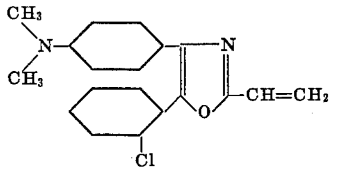

18. A photographic reproduction process according to claim 12 in which the compound has the formula

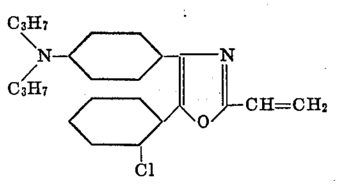

19. A photographic reproduction process according to claim 12 in which the compound has the formula

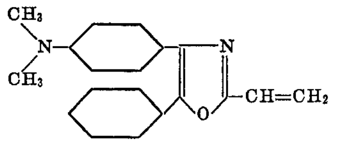

20. A photographic reproduction process according to claim 12 in which the compound has the formula

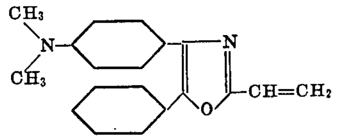

21. A photographic reproduction process according to claim 12 in which the compound has the formula

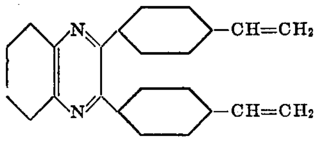

* * * * *

UNITED STATES PATENT OFFICE
CERTIFICATE OF CORRECTION

Patent No. 3,650,745 Dated March 21, 1972

Inventor(s) Ernst-August Hackmann et al

It is certified that error appears in the above-identified patent and that said Letters Patent are hereby corrected as shown below:

Column 8, the structural formula of Claim 10. should read as follows:

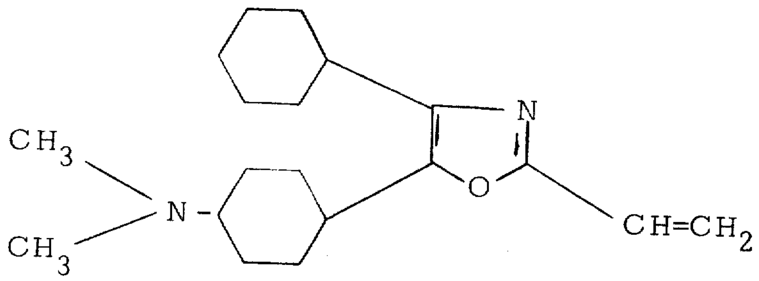

Column 10, the structural formula of Claim 20. should read as follows:

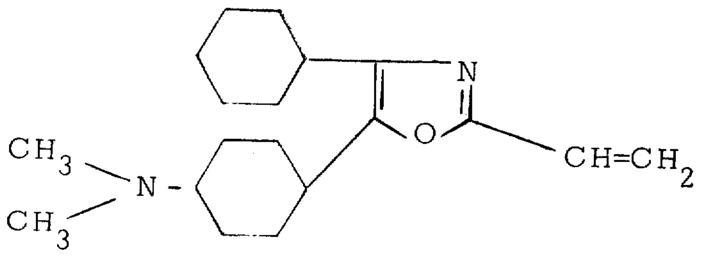

Signed and sealed this 1st day of August 1972.

(SEAL)
Attest:

EDWARD M.FLETCHER,JR.
Attesting Officer

ROBERT GOTTSCHALK
Commissioner of Patents